United States Patent
Christensen

(10) Patent No.: US 6,778,023 B2
(45) Date of Patent: Aug. 17, 2004

(54) TUNABLE FILTER AND METHOD OF TUNING A FILTER

(75) Inventor: Kaare Tais Christensen, Copenhagen (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/917,704

(22) Filed: Jul. 31, 2001

(65) Prior Publication Data

US 2003/0025563 A1 Feb. 6, 2003

(51) Int. Cl.[7] .................................................. H03L 7/00
(52) U.S. Cl. ....................................... 331/16; 333/17.1
(58) Field of Search ......................... 331/1 R, 16, 18, 331/34, 47, 48, 117 R; 333/17.1

(56) References Cited

U.S. PATENT DOCUMENTS

| | | | | |
|---|---|---|---|---|
| 4,417,220 A | * | 11/1983 | Holyman et al. | ........... 333/174 |
| 5,281,931 A | * | 1/1994 | Bailey et al. | .............. 333/17.1 |
| 5,420,552 A | * | 5/1995 | Sakka | ........................ 333/17.1 |
| 5,550,520 A | * | 8/1996 | Kobayashi | ................... 333/213 |
| 5,731,737 A | * | 3/1998 | Cranford et al. | ............ 327/552 |
| 5,945,889 A | * | 8/1999 | Shanthi-Pavan et al. | ... 333/17.1 |
| 6,137,375 A | * | 10/2000 | Li | ............................. 331/175 |
| 6,307,442 B1 | * | 10/2001 | Meyer et al. | .............. 333/17.1 |
| 6,307,443 B1 | * | 10/2001 | Gabara | ....................... 333/17.1 |

* cited by examiner

Primary Examiner—Michael Tokar
Assistant Examiner—Linh Van Nguyen
(74) Attorney, Agent, or Firm—Antonelli, Terry, Stout & Kraus, LLP

(57) ABSTRACT

A bandpass filter is tuned by converting the filter into an oscillator using a negative resistance circuit, tuning the oscillator by using conventional tuning techniques such as tuning a varactor via a phase locked loop, sampling and holding the tuning signal and switching off the negative resistance circuit to convert the oscillator back into a bandpass filter.

8 Claims, 9 Drawing Sheets

TUNABLE FILTER AND METHOD OF TUNING A FILTER

FIELD OF THE INVENTION

The present invention relates to tunable filters, particularly but not exclusively to the tuning of the center frequency of a bandpass filter.

BACKGROUND

A common problem in the design of bandpass filters is the need to tune the center frequency. Current component tolerances rarely provide the required accuracy, so some form of frequency tuning is inevitably required.

A paper presented at the 1999 IEEE International Solid-State Circuits Conference: "High-Frequency Analog Filters in Deep-Submicron CMOS Technology", R. Castello, I. Bietti, F. Svelto, ISBN 0-7803-5126-6/99, describes an LC based filter using a master-slave frequency tuning scheme. This scheme uses the same reactive elements, in this case, MOS varactors, in a bandpass filter acting as slave and a voltage controlled oscillator (VCO) acting as master. The center frequency of the filter is controlled by the same signal as the oscillator, so that when the oscillator is operating at a desired frequency, that frequency becomes the center frequency of the filter.

The master-slave technique relies on matching two different structures, namely the filter and the VCO, which can only be done to an accuracy of 1–2 percent. Furthermore, the technique involves substantial additional chip area and power consumption.

The present invention aims to address the above problems.

SUMMARY OF THE INVENTION

According to the invention, there is provided a method of tuning a filter, the filter being associated with a center frequency, comprising the steps of configuring said filter as an oscillator, tuning said oscillator to a desired frequency and reconfiguring said oscillator to operate as said filter with said desired frequency as said center frequency.

By converting the filter itself into an oscillator and tuning the oscillator, few additional components are required, so saving on chip area and power consumption. Furthermore, by comparison with solutions in which the operational filter is matched to a second similar filter or oscillator using the same reactive components, the inherent limitations resulting from the matching of similar but non-identical structures is removed.

According to the invention, there is further provided a tunable filter, comprising a filter circuit having a center frequency and a configuration circuit operable to configure said filter circuit as an oscillator, whereby to permit said oscillator to be tuned to a desired frequency, said configuration circuit further being operable to reconfigure said oscillator to operate as said filter with said desired frequency as said center frequency.

The invention also provides a tunable filter, comprising a filter circuit having a center frequency and means for configuring said filter circuit as an oscillator, whereby to permit said oscillator to be tuned to a desired frequency, said means further being operable to reconfigure said oscillator to operate as said filter with said desired frequency as said center frequency.

The filter can be a bandpass filter or a notch filter.

The invention additionally provides a method of tuning a filter, said filter comprising reactive components which determine a resonant frequency of the filter, said method comprising the steps of configuring the filter as an oscillator and tuning at least one of said reactive components while the filter is configured as said oscillator.

According to the invention, there is yet further provided a programmable filter comprising a filter circuit, a compensation circuit and a memory for storing at least one digital word, wherein the compensation circuit is operable to configure said filter circuit as an oscillator, whereby to permit said oscillator to be tuned to at least one desired frequency in accordance with a tuning signal, said tuning signal being derived from said at least one digital word, said compensation circuit further being operable to reconfigure said oscillator to operate as said filter after tuning.

By storing a plurality of digital words in the memory, each representing a different center frequency for a bandpass filter, the filter can be quickly programmed to operate at different frequencies depending on operational requirements.

BRIEF DESCRIPTION OF THE DRAWINGS

Embodiments of the invention will now be described, by way of example, with reference to the accompanying drawings, in which:

FIG. 8b illustrates a MOS varactor for implementing the variable capacitor of FIG. 8a;

FIG. 8c illustrates a diode varactor for implementing the variable capacitor of FIG. 8a;

FIG. 8d illustrates a Miller capacitance arrangement for implementing the variable capacitor of FIG. 8a;

FIG. 9b illustrates a current feedback arrangement for implementing the variable inductor of FIG. 9a;

FIG. 10a illustrates a binary weighted switched capacitor bank for implementing the variable capacitor of FIG. 8a;

FIG. 10b illustrates a binary weighted switched inductor bank for implementing the variable inductor of FIG. 9a;

DETAILED DESCRIPTION

Figure 1:
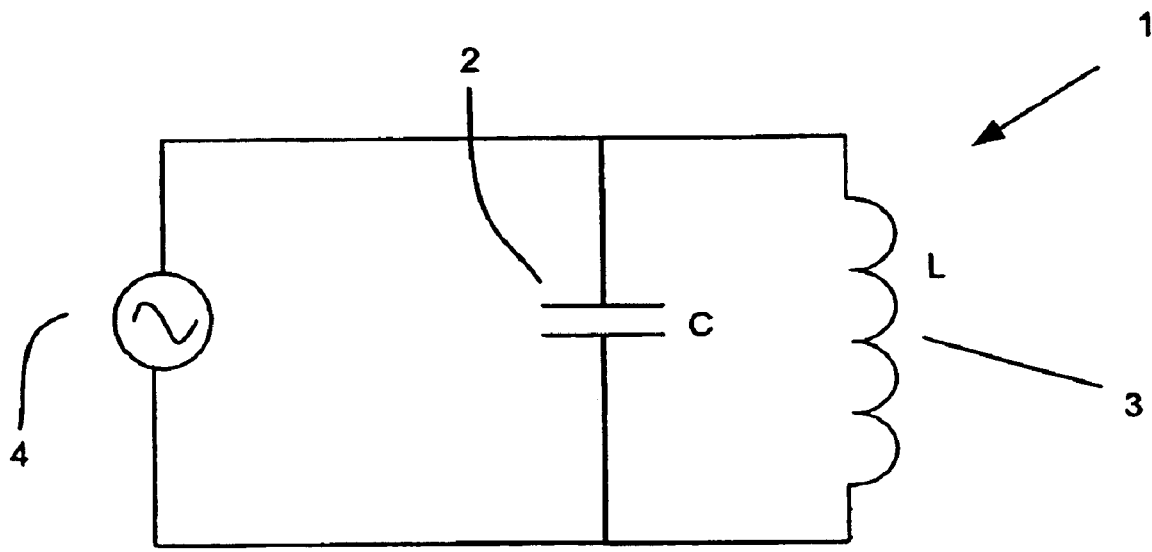
FIG. 1 illustrates a conventional LC tank circuit comprising a capacitor and an inductor in parallel.

FIG. 1 shows a conventional tank circuit 1 having a capacitor 2 and an inductor 3 in parallel. In the ideal tank circuit shown, excited by a source 4, energy flows back and forth between the capacitor and the inductor with no losses, the resonant frequency of $f_0$ the circuit being given by the equation:

$$f_0 = \tfrac{1}{2}\pi\sqrt{(LC)}$$

Figure 2:
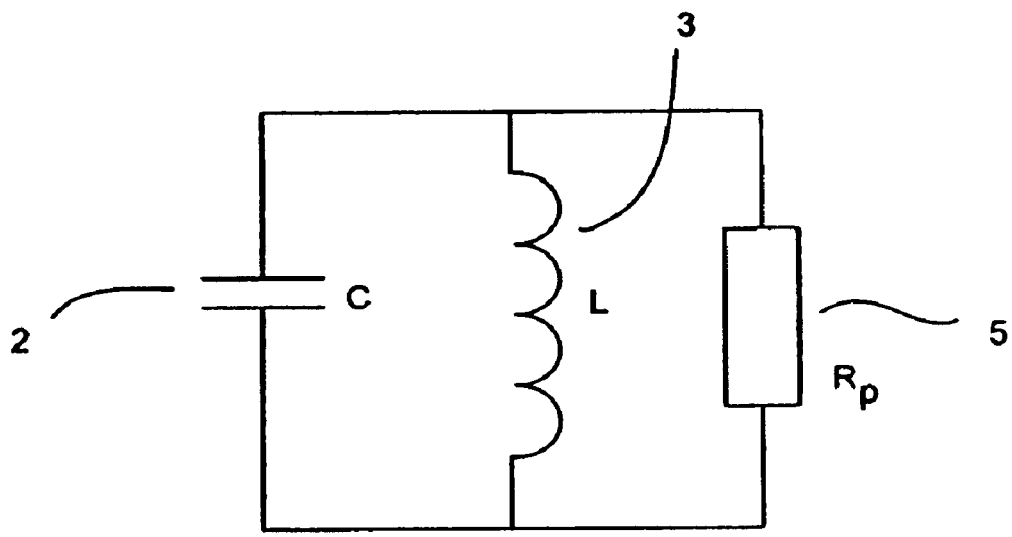
FIG. 2 shows the equivalent circuit diagram for the LC tank of FIG. 1a, illustrating the presence of a parasitic resistance.

However, in a practical LC tank circuit, energy is lost due to parasitic resistance in the capacitor and the inductor, which can be modelled as a parallel resistance $R_p$ 5 in the equivalent circuit shown in FIG. 2.

Figure 3:
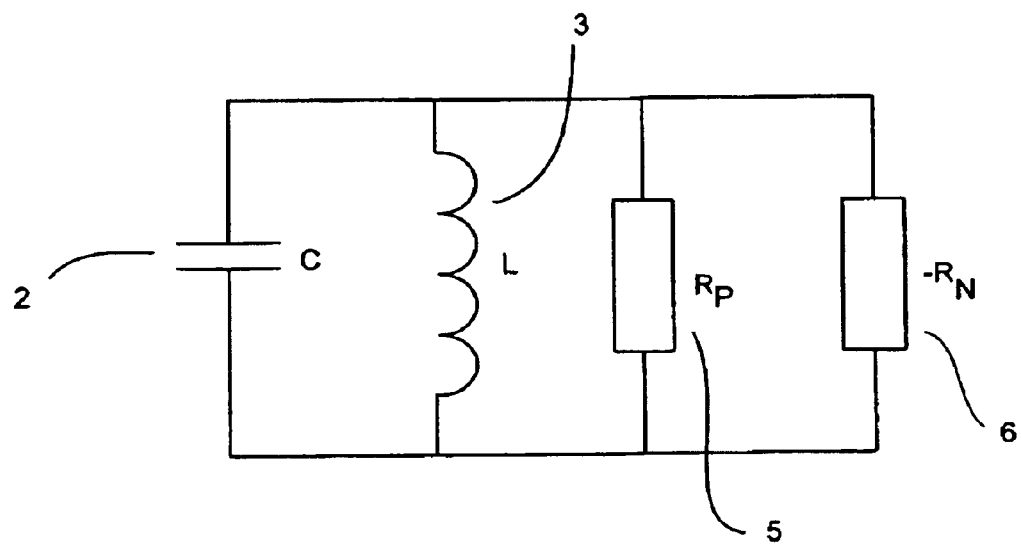
FIG. 3 illustrates an equivalent circuit in which the parasitic resistance is compensated for by a negative resistance.

An active circuit can be constructed, using transistors, which exhibits opposite behaviour to that of a resistor. Such a circuit is referred to herein as a loss compensation or negative resistance circuit and can be modelled as $-R_N$ 6 in the equivalent circuit shown in FIG. 3.

Figure 4:
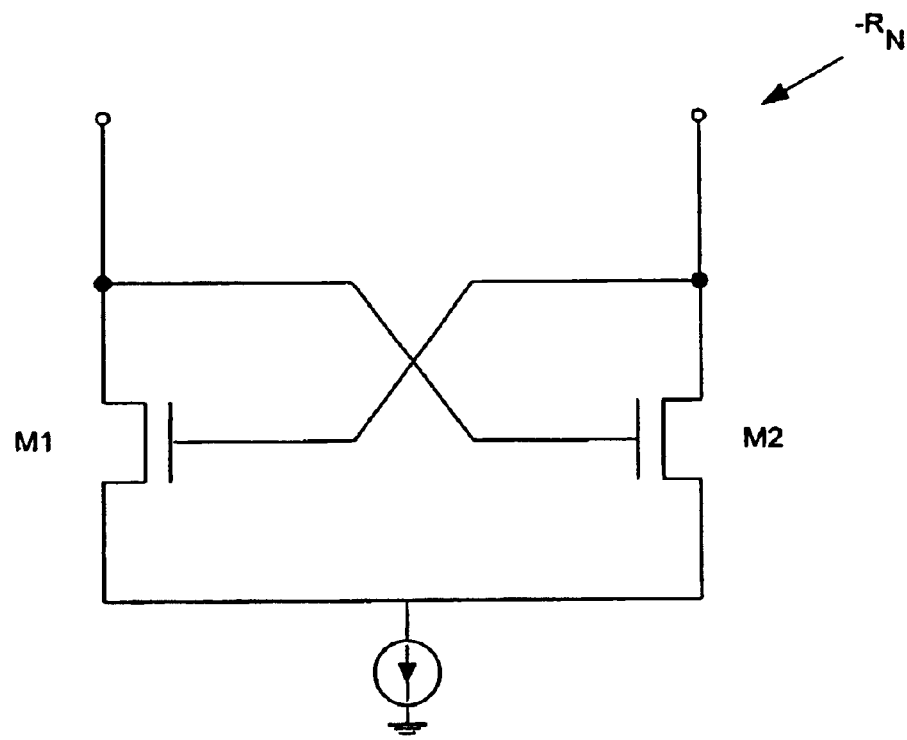
FIG. 4 shows an example of a negative resistance circuit.

An example loss compensation/negative resistance arrangement $-R_N$ 6 using a cross-coupled transistor pair M1, M2 with tail-current (I) biasing, is illustrated in FIG. 4.

Figure 5:
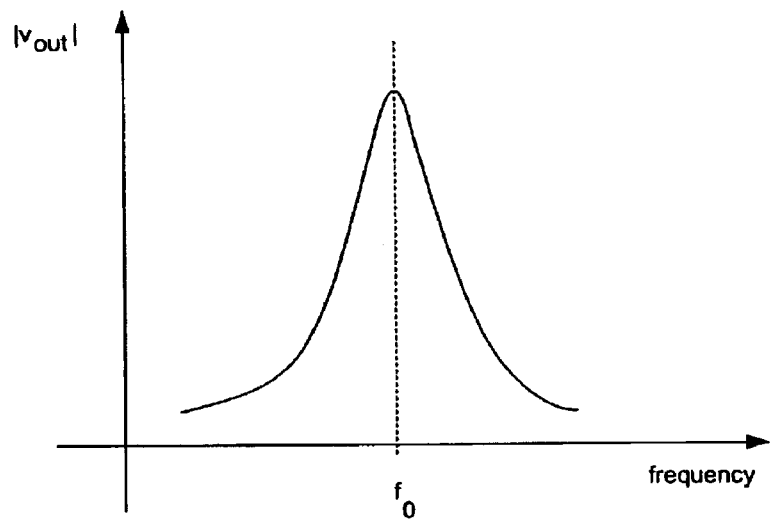
FIG. 5 illustrates the frequency response of a bandpass filter.

Referring again to FIG. 3, when $R_N = R_p$, the two resistors in parallel provide an effective open circuit, so that the negative resistance compensates for the energy losses in the tank circuit, causing the circuit to behave as an oscillator. If $R_p$ is not entirely compensated for, the tank circuit 1 has losses and acts as a bandpass filter, the frequency response of which is shown in FIG. 5, illustrating that the filter has a center frequency $f_0$, which can be shown to be the same as the resonant frequency of the tank circuit.

Figure 6:
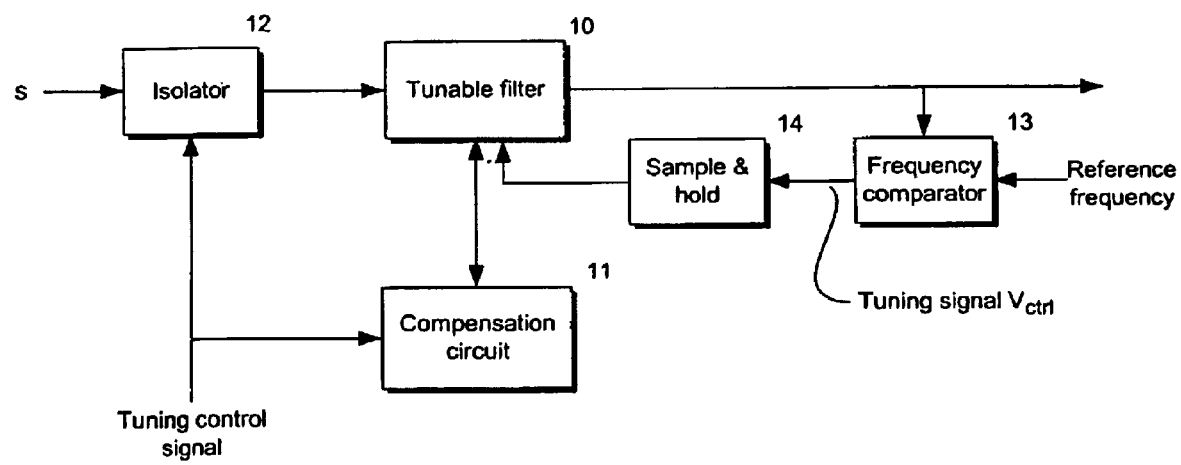
FIG. 6 illustrates a tunable filter circuit according to an example of the invention.

Referring to FIG. 6, a tunable filter arrangement in accordance with the invention comprises a tunable filter 10 including an LC tank together with a compensation circuit 11, for example a negative resistance circuit. The filter 10 receives an input signal S via an isolator 12, for example a switch for isolating the filter 10 from the input signal. Both the isolator 12 and compensation circuit 11 receive a tuning control signal. The output of the filter 10 is connected to a frequency comparator 13 which produces a tuning signal which adjusts the resonant frequency of the filter circuit 10. A sample and hold circuit 14 is arranged to store the tuning signal once the desired frequency is achieved. The operation of the system of FIG. 6 will now be described in detail with reference to FIG. 7.

Figure 7:
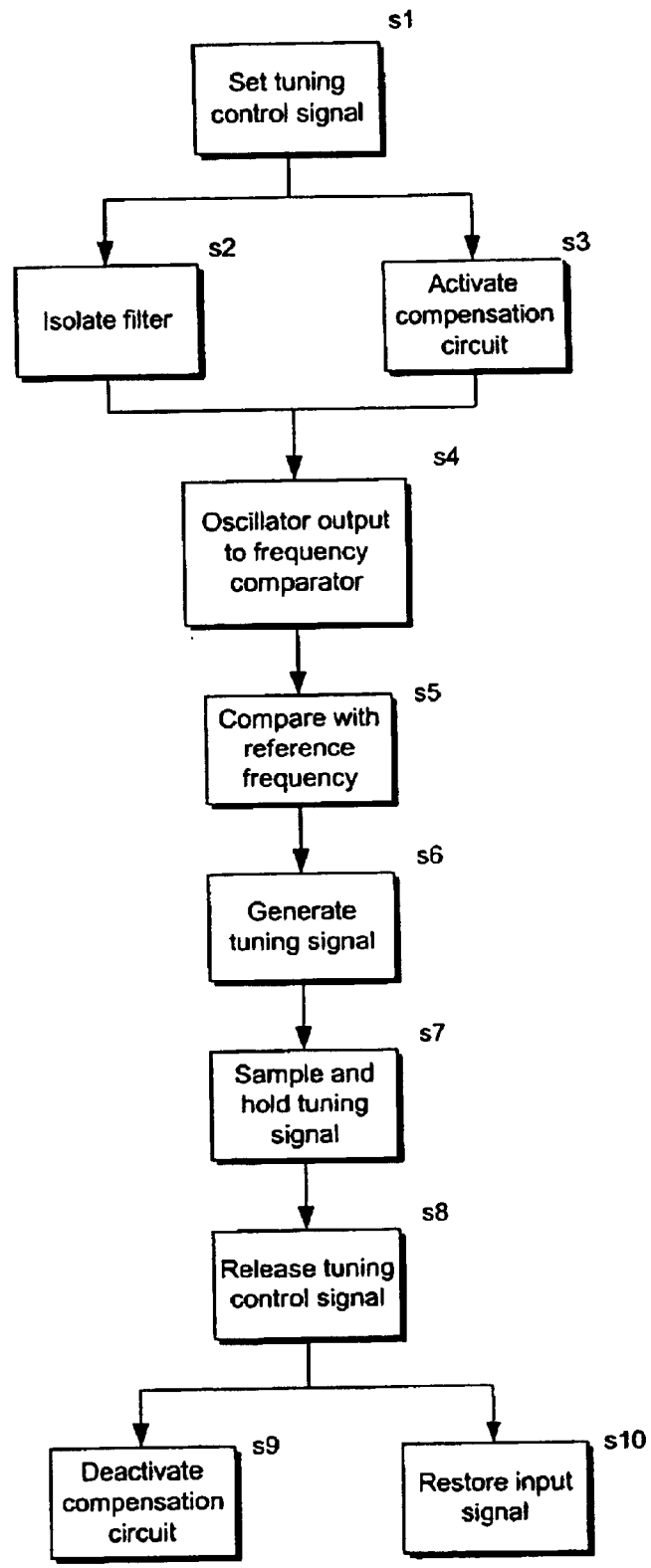
FIG. 7 is a flow diagram illustrating the operation of the circuit of FIG. 6.

Referring to FIG. 7, when a tuning cycle is to commence, a tuning control signal is set (step s1) to isolate the filter 10 from the input signal S via the isolator 12 (step s2) and to activate the compensation circuit 11 (step s3), so converting the filter 10 into an oscillator. The oscillator 10 then oscillates at the resonant frequency set by the tank circuit's reactive components. The output of the tunable filter circuit acting as an oscillator 10 is fed to the frequency comparator circuit 13 (step s4). This compares the output frequency with a desired or reference frequency (step s5) and outputs a tuning signal to alter the resonant frequency of the filter 10 towards the desired frequency (step s6). The resonant frequency is tuned by any one of a number of techniques which will be described below, usually involving the use of the tuning signal to alter a tunable element such as the capacitance of the tank circuit. Once the desired resonant frequency has been achieved, the tuning signal is sampled in the analog or digital domain and held so that it can be continuously applied to the tunable element (step s7). The tuning control signal is then released (step s8), resulting in deactivation of the compensation circuit 12 (step s9), so turning the oscillator back into a bandpass filter 10. The release of the tuning control signal also causes the input signal to the bandpass filter 10 to be restored (step s10).

Figure 8A:
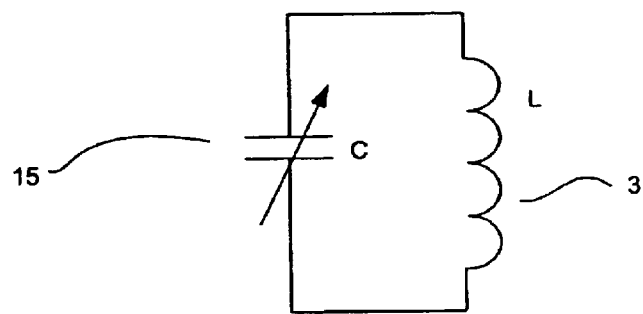
FIG. 8a illustrates a tank circuit in which a variable capacitor acts as the frequency tuning element.
Figure 8B:
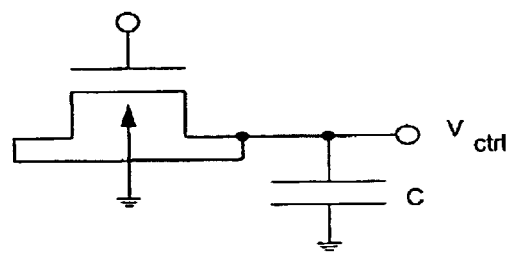
Figure 8C:
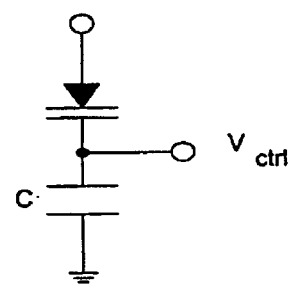
Figure 8D:
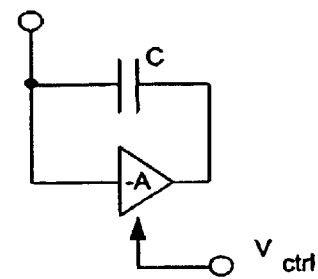

Tuning of the filter/oscillator 10 can be achieved in a number of ways. Some of the many possible arrangements are illustrated in FIG. 8. FIG. 8a illustrates a basic tank circuit in which a variable capacitor 15 acts as the frequency tuning element. The variable capacitor can be implemented as a MOS varactor, as shown in FIG. 8b, or as a diode varactor shown in FIG. 8c. An alternative to varactor tuning is to provide active circuitry to provide feedback. For example, FIG. 8d illustrates the well-known Miller capacitance arrangement which uses negative feedback to alter the effective value of a linear capacitor.

Figure 9A:
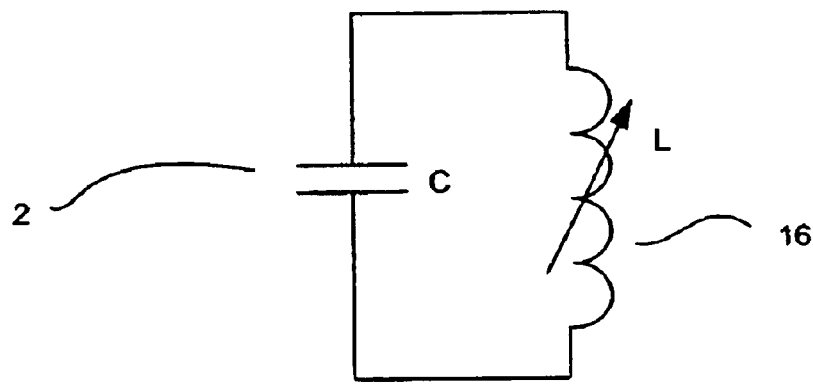
FIG. 9a illustrates a tank circuit in which a variable inductor acts as the frequency tuning element.
Figure 9B:
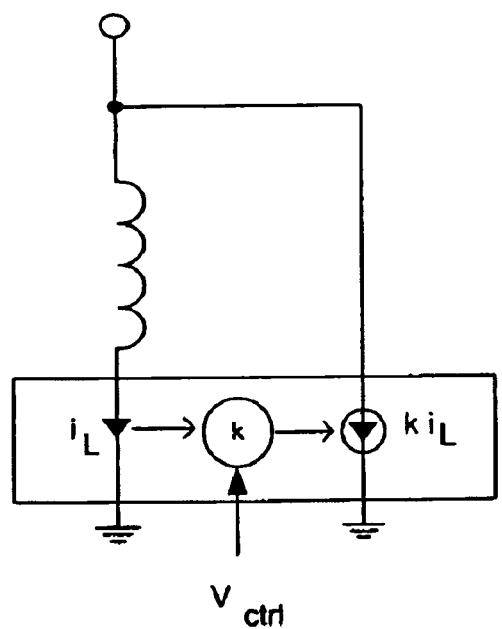

In an alternative embodiment, the inductor 16 in the tank circuit can be the tunable element, as illustrated in FIG. 9a. A variable inductor can be implemented by the current feedback arrangement shown in FIG. 9b, by analogy with the Miller capacitance shown in FIG. 8d.

Figure 10A:
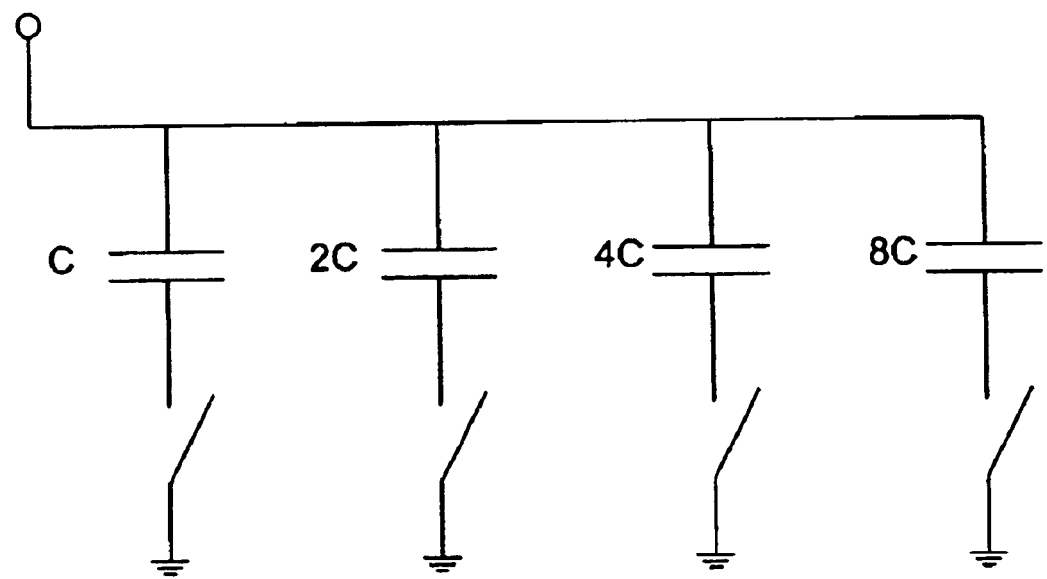
Figure 10B:
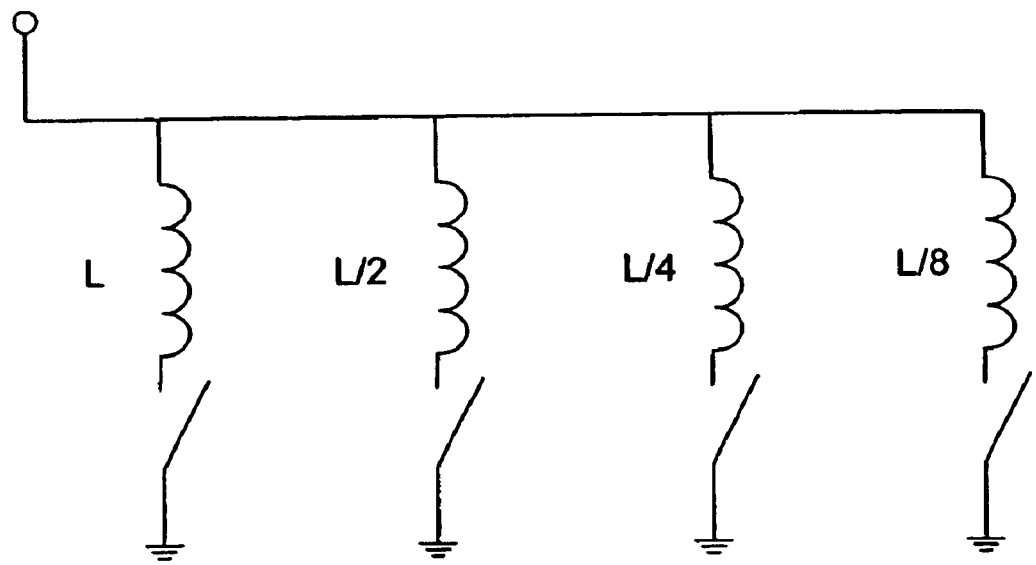

As an alternative to the tunable element arrangements shown in FIGS. 8 and 9, tuning can be implemented by switching passive elements such as capacitors and inductors in or out of an LC circuit. FIG. 10a illustrates a binary weighted switched capacitor bank and FIG. 10b illustrates a binary weighted switched inductor bank. By switching one or more components in or out of the filter circuit under the control of the tuning signal $V_{ctrl}$, a desired frequency range can be covered with a resolution set by the smallest unit element.

Figure 11:
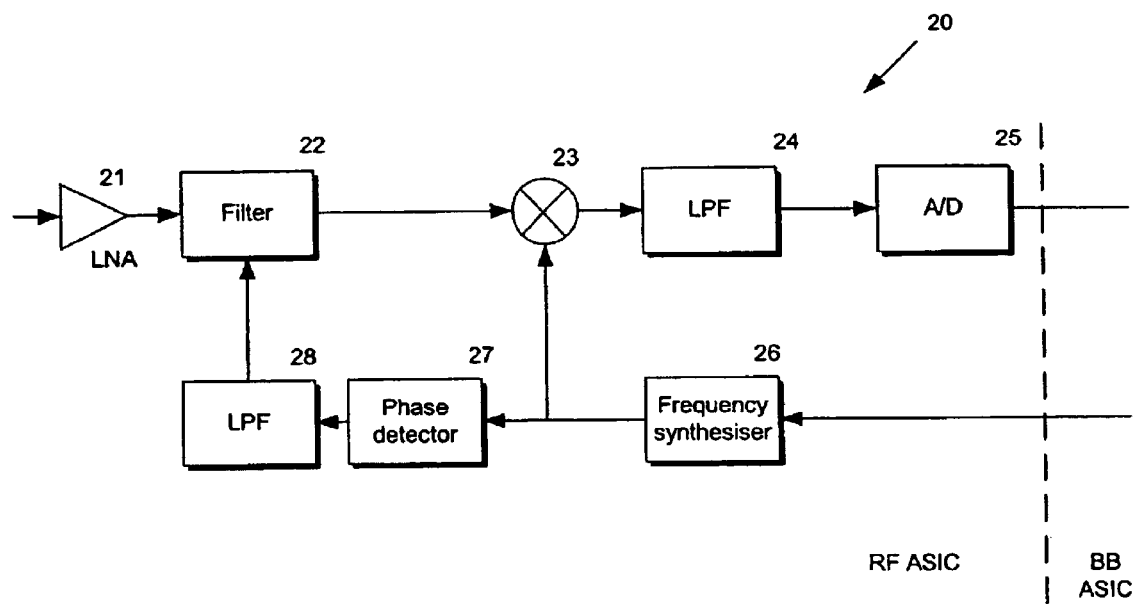
FIG. 11 illustrates a radio frequency circuit in a direct conversion receiver using a tuning arrangement according to the invention.
Figure 12:
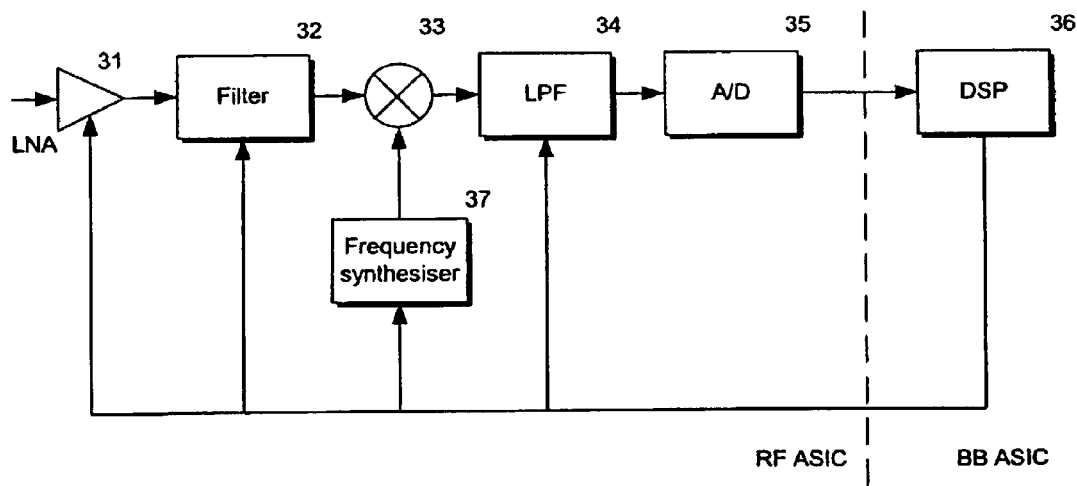
FIG. 12 illustrates a tuning arrangement using DSP controlled tuning.

FIGS. 11 and 12 illustrate two systems which use existing circuitry in an RF receiver to simplify the tuning system according to the invention. FIG. 11 illustrates a radio frequency circuit in a direct conversion receiver 20, implemented for example by an application specific integrated circuit (ASIC). The circuit includes an RF receiver chain comprising a low noise amplifier LNA 21, a bandpass filter 22, a mixer 23, a lowpass filter LPF 24 and an analog-to-digital A/D converter 25. The mixer 23 receives an input from a frequency synthesiser 26. As described in relation to the example above, the filter 22 is isolated by turning the LNA 21 off and is then turned into an oscillator by using a compensation circuit (not shown). The oscillator 22 is then locked to the receiver's reference frequency, provided by the frequency synthesiser 26, using a phase locked loop which comprises the oscillator 22, a phase detector 27 and a low pass filter 28. As described above in relation to the first example, once the oscillator has been tuned to the reference frequency, the control signal is sampled and held and the compensation circuit is deactivated, turning the oscillator 22 back into a correctly tuned bandpass filter. The input signal is then restored and the filtered signal multiplied with the reference frequency, low pass filtered and converted to a digital signal in the analog-to-digital converter 25 for further processing by the baseband circuitry BB of the direct conversion receiver. The phase locked loop can be implemented in the analog or digital domain. Where the tuning element is implemented as a switched capacitor bank, the frequency drift is very low, so that frequency tuning can be performed once only, as a calibration step, and the resulting control value stored in a look-up table.

Referring to FIG. 12, an RF receiver chain comprises an LNA 31, a bandpass filter 32, a mixer 33, a lowpass filter LPF 34 and an analog-to-digital converter A/D 35. The mixer receives an input from a frequency synthesiser 37. The output of the A/D converter 35 is input to a digital signal processor DSP 36, which controls the LNA 31, filter 32, LPF 34 and frequency synthesiser 37. The tuning algorithm is implemented in software. The bandpass filter 32 is again turned into an oscillator and the oscillator frequency is swept over its entire range. The setting that yields a signal at the output is stored in a look-up table. This process can be repeated until the entire frequency range of the bandpass filter is recorded.

Figure 13:
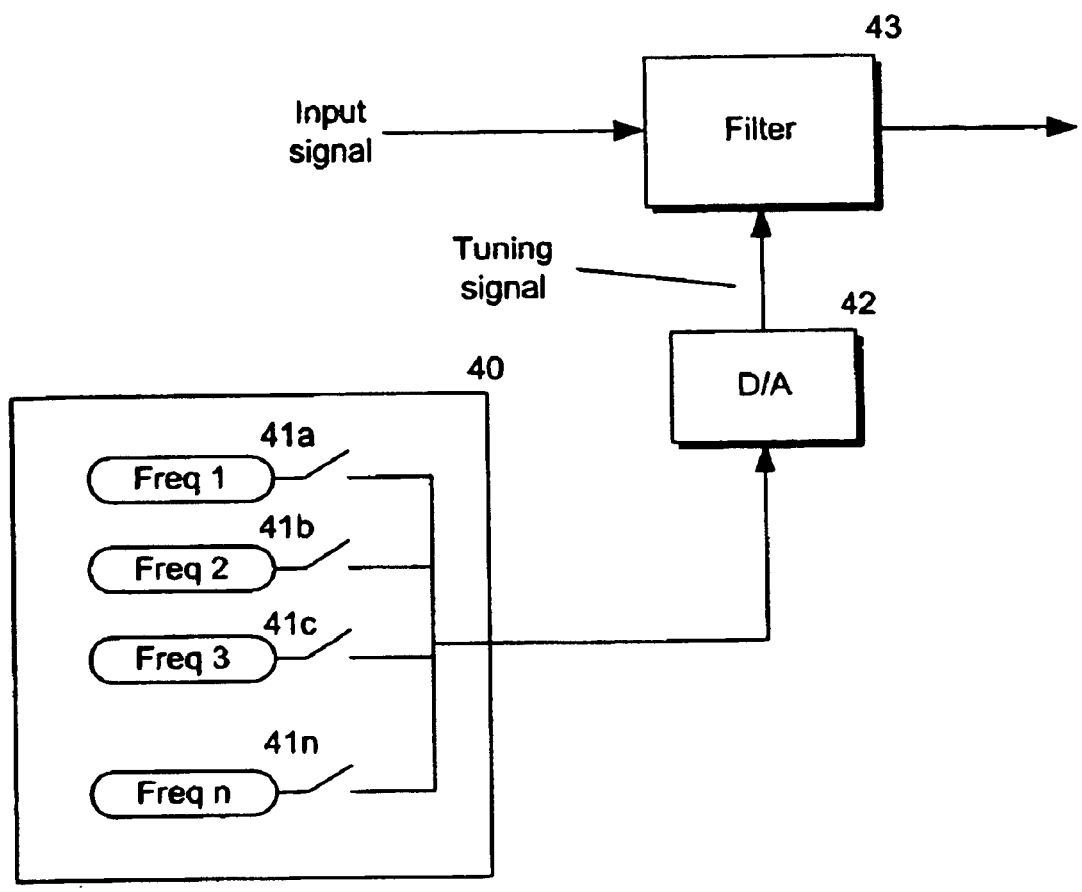
FIG. 13 is a schematic diagram of a programmable tunable filter.

While normal filter operation cannot be carried out while the filter is being tuned, in the majority of cases this is not a problem. In particular, the filter can be calibrated as a one-off procedure the first time it is turned on. For example, referring to FIG. 13, a programmable filter according to the invention has a memory 40 for pre-storing a digital word 41a-n for each of the desired frequencies, so that when it is switched on, the word corresponding to the desired frequency is applied to a digital to analog converter 42 that provides a tuning signal to the filter 43. This leads to a fast programmable filter.

Furthermore, in most high performance communication systems, some kind of time-division multiplexing and/or frequency hopping is employed, so that continuous filter operation is not required. Such systems would allow a filter to be tuned, for example, every millisecond. Most systems also use error correction and are therefore robust to very short periods of time without signal, during which time the filter can be fine tuned.

What is claimed is:

1. A method of tuning a filter, the filter being associated with a center frequency, comprising:
    configuring said filter as an oscillator;
    tuning said oscillator to a desired frequency according to a tuning signal;
    reconfiguring said oscillator to operate as said filter with said desired frequency as said center frequency; and
    recording the tuning signal which causes said oscillator to operate at the desired frequency.

2. The method according to claim 1, wherein the step of recording the tuning signal comprises sampling and holding the tuning signal.

3. A The method according to claim 2, further comprising storing the sampled signal in a register.

4. The method according to claim 1, wherein the filter includes a tank circuit, the tuning of the oscillator comprising tuning the resonant frequency of the tank.

5. A programmable filter comprising:
    a filter circuit;
    a compensation circuit; and
    a memory for storing at least one digital word;
    wherein the compensation circuit is operable to configure said filter circuit as an oscillator, whereby to permit said oscillator to be tuned to at least one desired frequency in accordance with a tuning signal, said tuning signal being derived from said at least one digital word, said compensation circuit further being operable to reconfigure said oscillator to operate as said filter after tuning.

6. A programmable filter according to claim 5, further comprising a digital to analog converter for receiving said at least one digital word and providing said tuning signal.

7. The programmable filter according to claim 5, wherein the filter comprises a band pass filter.

8. The programmable filter according to claim 7, wherein the memory includes a plurality of digital words, each word corresponding to a tuning signal which represents a desired center frequency for the filter.

* * * * *